US007427732B2

(12) United States Patent
Thomas et al.

(10) Patent No.: US 7,427,732 B2
(45) Date of Patent: Sep. 23, 2008

(54) METHOD FOR TARGETING A SOURCE OF AN INCOMING LASER

(75) Inventors: Vicraj T. Thomas, Golden Valley, IN (US); Michael L Rhodes, Richfield, MN (US); Philip J. Zumsteg, Shorewood, MN (US); Jan Jelinek, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/678,043

(22) Filed: Feb. 22, 2007

(65) Prior Publication Data

US 2007/0278391 A1    Dec. 6, 2007

Related U.S. Application Data (62) Division of application No. 10/622,819, filed on Jul. 18, 2003, now Pat. No. 7,196,301.

(51) Int. Cl.
G01C 21/02 (2006.01)

(52) U.S. Cl. ............. 250/206.1; 250/203.2; 250/203.3; 250/216; 340/600; 356/141.2; 356/141.5; 342/45; 359/813; 359/619

(58) Field of Classification Search ............. 250/203.1, 250/203.2, 203.3, 206.1, 216; 340/555–557, 340/600; 342/45; 359/813, 619
See application file for complete search history.

(56) References Cited

U.S. PATENT DOCUMENTS

| 5,142,288 | A | * | 8/1992 | Cleveland | 342/45 |
|---|---|---|---|---|---|
| 5,274,379 | A | * | 12/1993 | Carbonneau et al. | 342/45 |
| 5,280,167 | A | * | 1/1994 | Dubois | 250/214 VT |
| 5,500,525 | A | * | 3/1996 | Saban | 250/221 |
| 5,734,490 | A | * | 3/1998 | Rabarot et al. | 359/210 |
| 5,923,480 | A | * | 7/1999 | Labeye | 359/814 |
| 6,445,514 | B1 | * | 9/2002 | Ohnstein et al. | 359/813 |
| 6,660,988 | B2 | | 12/2003 | Lee et al. | |
| 6,842,290 | B2 | * | 1/2005 | Liang et al. | 359/619 |
| 6,884,985 | B2 | | 4/2005 | Raynor | |
| 7,196,301 | B2 | | 3/2007 | Thomas et al. | |
| 2004/0041724 | A1 | * | 3/2004 | Levitan et al. | 342/22 |
| 2004/0208596 | A1 | | 10/2004 | Bringans et al. | |

OTHER PUBLICATIONS

U.S. Appl. No. 11/678,039, filed on Feb. 22, 2007, entitled "Method for Detecting a Source of an Incoming Laser."

(Continued)

Primary Examiner—Stephen Yam
(74) Attorney, Agent, or Firm—Black Lowe & Graham PLLC (57) ABSTRACT

A system and method for laser source detection. An exemplary embodiment of the system includes a first array of lenses, a second array of opto devices (including light sources and light detectors), and at least one processor. By positioning the array of lenses to determine the lens position at which energy from an incoming laser is greatest on the light detectors, the approximate location of the laser source may be determined. Upon determining the source, responsive action may be taken. If the incoming laser is from a friendly party, a friendly-party notification may be provided. If the incoming laser is from an enemy, reciprocal targeting or false reflections may be employed.

3 Claims, 7 Drawing Sheets

OTHER PUBLICATIONS

U.S. Appl. No. 11/272,527, filed on Nov. 11, 2005, entitled "Laser Source Detection System and Method".

Benecke, Glenn J. "Performance Testing of the AN/VVR-1 Laser Warning Receiver," http://www.dtic.mil/ndia/ground/benec.pdf, printed on Jun. 25, 2003.

Johnson et al., "Honeywell Technology Center Steered Agile Beams Program—DARPA/MTO Steered Agile Beans 9STAB) Kickoff Meeting," Aug. 8-9, 2000.

* cited by examiner

METHOD FOR TARGETING A SOURCE OF AN INCOMING LASER

CROSS REFERENCE TO RELATED APPLICATIONS

This application is a divisional of U.S. patent application Ser. No. 10/622,819 filed Jul. 18, 2003.

GOVERNMENT CONTRACT

The Government may have rights in this invention pursuant to Contract F33615-02-C-1175, awarded by the Department of the Air Force.

BACKGROUND

The present invention relates to laser source detection, and more particularly, to a system and method for laser source detection.

Modern weapons systems frequently use lasers to assist in targeting. Because the path of a laser beam is essentially a straight line, it can be used as a starting point for sighting a weapon, and adjustments may be made to compensate for gravity, wind, and other factors. Some weapons systems employ a beam-riding scheme, in which a munition, such as a missile, tracks the path of a laser beam to a target painted by the laser. One of the effects of laser-assisted targeting is improved accuracy and precision.

At the same time, a party painted by such a laser needs to be able to react in a quick and appropriate manner. Regardless of whether the source of the laser is an enemy or friendly party, the painted party needs to avoid any munitions that may be fired. If the source of the painting laser is a friendly party, the painted party will preferably be identified as a non-enemy, and no munitions will be fired. "Friendly-party notification" is becoming increasingly important, as friendly-fire incidents are making up increasingly larger percentages of total wartime casualties.

One approach similar to friendly-party notification is CIDDS (Combat IDentification Dismounted Soldier). In CIDDS, an interrogator set shines a laser on a target. If the targeted soldier is friendly and has a similar system, laser detectors will decode the signal and a radio transmitter on the targeted soldier responds with a coded message indicating he or she is friendly. This response message breaks radio silence, and thus, is a security risk. The CIDDS system is strictly a combat identification system, and does not detect or respond to lasers from range finders, battlefield illuminators, or target designator systems. The CIDDS helmet-mounted transponder is about 335 grams and has a range of approximately 1100 meters.

Another approach that provides a greater range (about 5500 meters ground-to-ground and 8000 meters air-to-ground), but is much heavier, is BCIS (Battlefield Combat Identification System). This vehicle-mounted system operates similarly to, but is not compatible with, CIDDS. Because communication responses are by radio, radio silence is broken. While BCIS is capable of identifying the source of a laser within a quadrant, it is still primarily a combat identification system, and does not detect or respond to lasers from range finding systems, battlefield illuminators, or target designator systems. Other similar systems, such as LWS-CV, also exist.

A technology that may improve laser detection capabilities is HARLID (High Angular Resolution Laser Irradiance Detector). While still primarily a prototype system, HARLID uses an array of detectors to locate the source of a laser within one degree (azimuth and elevation). However, HARLID is purely a detection system and provides no combat identification or reciprocal targeting capabilities. Raytheon's AN/VVR-1 Laser Warning Receiver may be an example of a HARLID-based system.

Other approaches have been developed to detect target designator, range finder, and beam rider threats, but actions taken upon detection (e.g. friendly-party notification) still suffer from shortcomings. To improve battlefield situation awareness, it would be desirable to accurately detect if a soldier or vehicle has been painted by a laser (e.g. range finder, target designator, beam rider, spotting beam, battlefield illuminator), locate the source of the laser, and provide friendly-party identification/notification. In addition, it would be desirable, in some embodiments, to provide reciprocal targeting to respond to imminent threats. The preferred solution should be relatively lightweight, easy-to-deploy, small, and interfaceable with existing systems, such as situation awareness systems (e.g. Objective Force Warrior displays and vehicle cockpit display systems) and target designators.

SUMMARY

A system and method for laser source detection are disclosed. An exemplary embodiment of the system includes a first array of movable lenses with associated positioning mechanisms, a second array of opto devices (including laser sources and laser detectors), and at least one processor. By positioning the individual lenses in the array to maximize the energy on their detectors, the approximate location of the laser source may be determined. Upon determining the source, responsive action may be taken. If the incoming laser is from a friendly party, a friendly-party notification may be provided. If the incoming laser is from an enemy, reciprocal targeting may be used to allow a laser-guided munition to be fired. Alternatively, at least one laser may be transmitted in a plurality of directions to cause false reflections, in an attempt to break a lock maintained by an incoming laser-guided munition.

These as well as other aspects of the present invention will become apparent to those of ordinary skill in the art by reading the following detailed description, with appropriate reference to the accompanying drawings.

DETAILED DESCRIPTION OF PRESENTLY PREFERRED EMBODIMENTS

Figure 1:
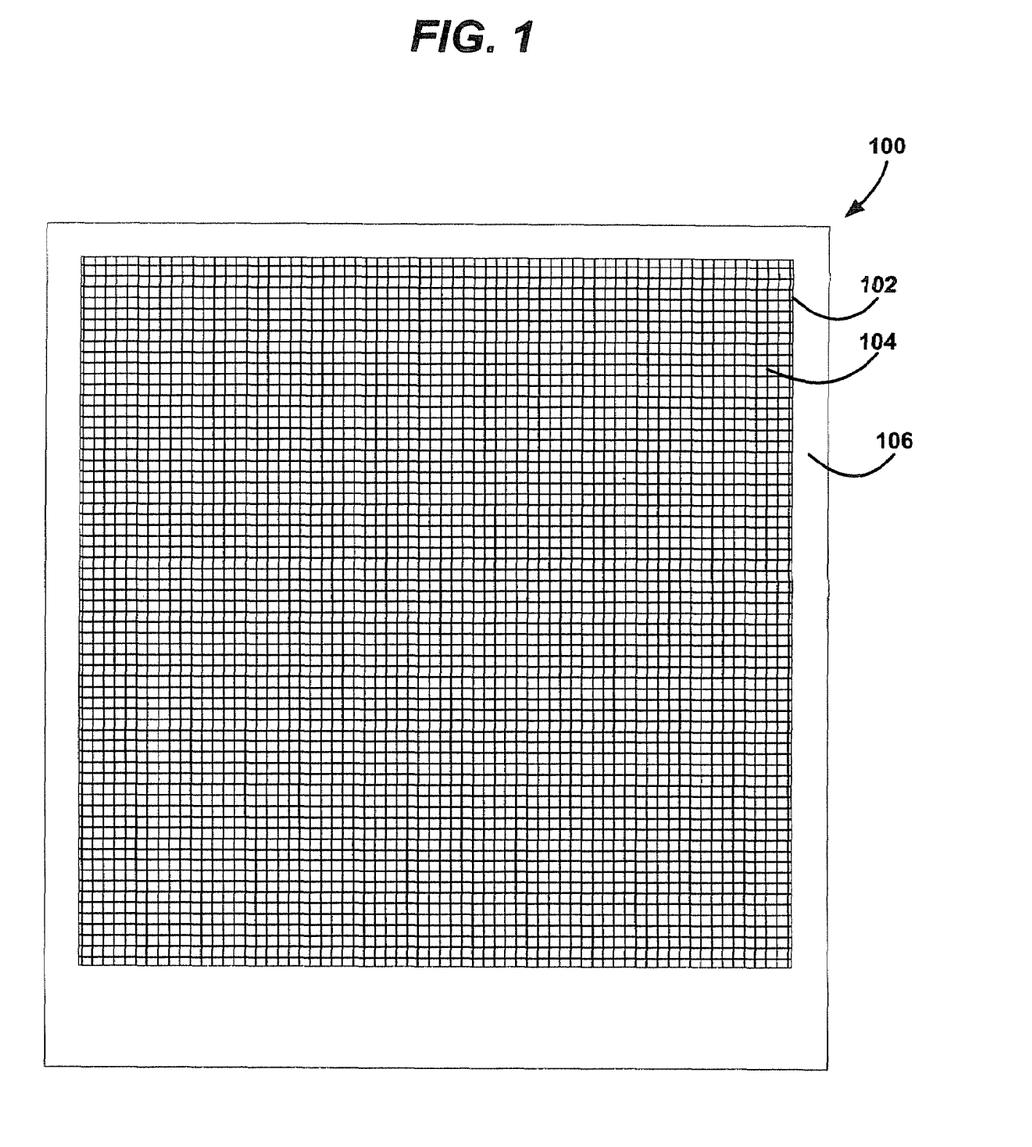
FIG. 1 is a simplified block diagram illustrating a system for laser source detection, according to an exemplary embodiment of the present invention.

FIG. 1 is a simplified block diagram illustrating a system 100 for laser source detection, according to an exemplary embodiment of the present invention. The system 100 includes an array 102 of cells, such as cell 104. The system 100 is operable to detect a remote laser source based on energy incident of the system. Upon detecting the laser, the facility 106 upon which the array 102 is mounted can take appropriate responsive action, such as transmitting a communication (e.g. a friendly-party notification) to the laser source or taking defensive action (e.g. transmitting light back toward the source to break any lock that an incoming light-guided munition may have on the facility 106).

In a preferred embodiment, the array 102 comprises many (e.g. tens, hundreds, thousands or more) cells 104, with each cell being small (e.g. approximately 1 mm$^2$), resulting in an overall array size of approximately 0.1 m$^2$ for use on military personnel to approximately 1 m$^2$ for use on military vehicles or installations). Smaller array sizes may be advantageous for portability and/or ease of placement, while larger array sizes will allow for more accurate laser source detection and location.

Figure 2:
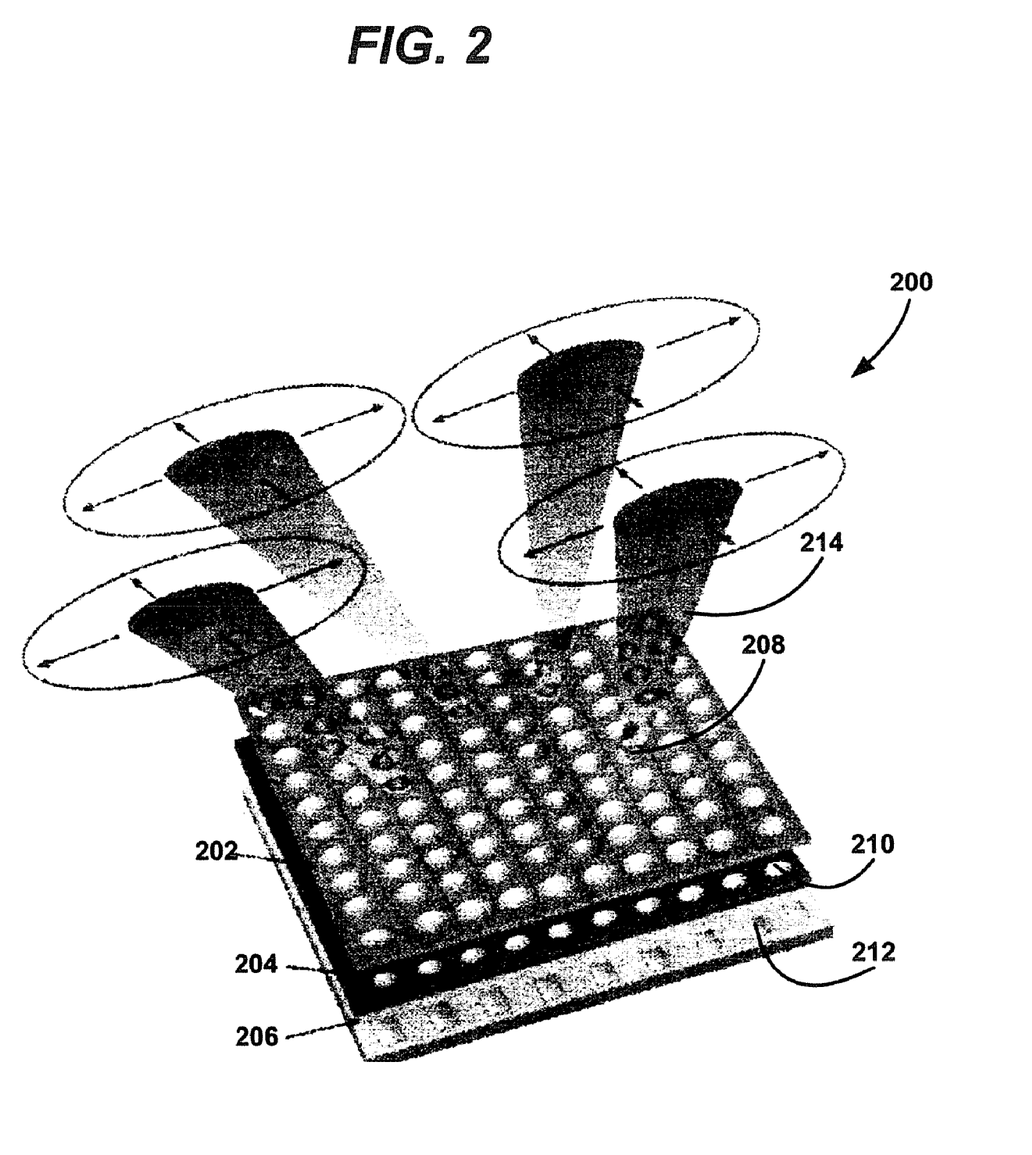
FIG. 2 is a perspective pictorial diagram illustrating a system for laser source detection, according to an exemplary embodiment of the present invention.
Figure 3A:
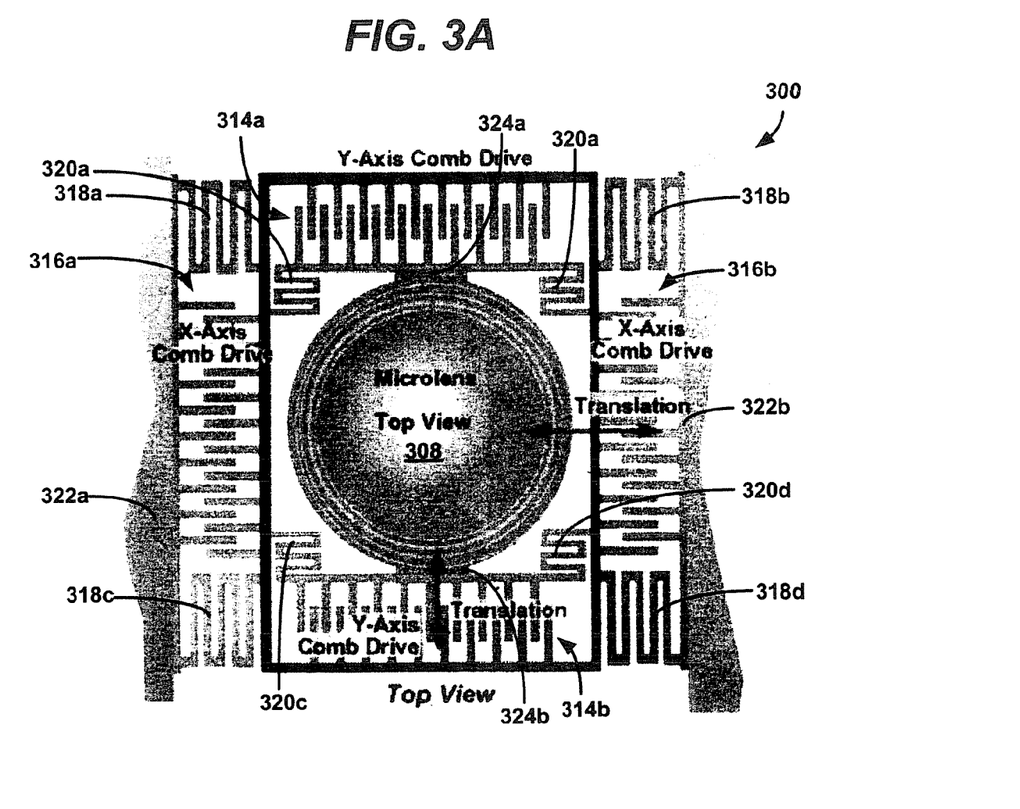
FIG. 3A is a pictorial diagram illustrating a top view of a representative cell in a system for laser source detection, according to an exemplary embodiment of the present invention.
Figure 3B:
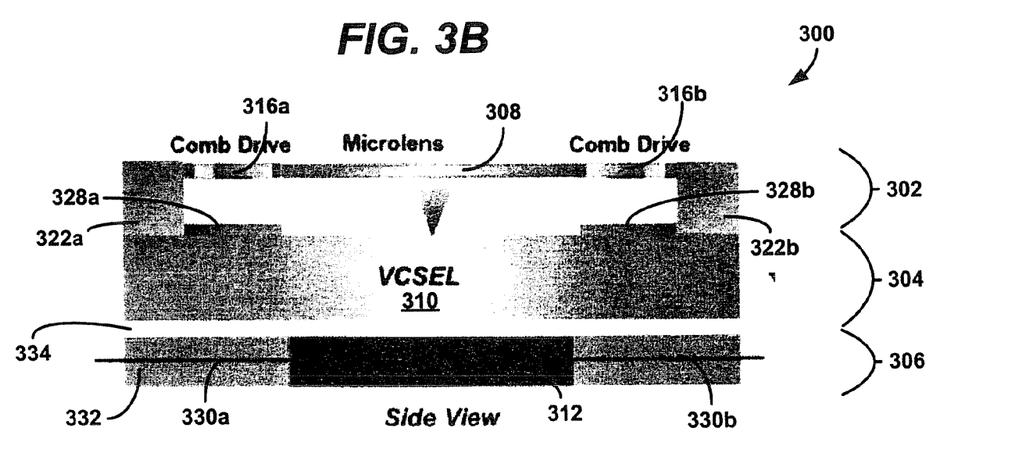
FIG. 3B is a pictorial diagram illustrating a side view of a representative cell in a system for laser source detection, according to an exemplary embodiment of the present invention.

As described in detail in FIGS. 2, 3A, and 3B, the array 102 preferably includes cells 104 for detecting light as well as cells 104 for transmitting light. So configured, the system 100 is operable to detect and locate light, as well as transmit light back for communication and/or reciprocal targeting. Because transmitted communications are preferably composed of light signals, radio silence is not compromised, resulting in potentially safer conditions for the facility 106. Another advantage of using light instead of radio is it is less susceptible to jamming and spoofing. For purposes of convenience and to more accurately describe how embodiments of the invention are likely to be used in the field, the remainder of this detailed description will assume the light is from a laser source.

FIG. 2 is a perspective pictorial diagram illustrating a system 200 for laser source detection, according to an exemplary embodiment of the present invention. The system 200 includes a lens array 202, an opto device array 204, and a driver array 206 that includes one or more compute elements. The system 200 is also likely to include an interface (not shown) that may be used to connect the system 200 to other equipment, such as weaponry and communications and/or computing systems, for example.

The lens array 202 includes a plurality of lens array cells 208, with each cell 208 preferably including an integrated MEMS (Micro-Electro-Mechanical Systems) diffractive microlens and actuator for positioning the lens. Each cell is preferably about 1 mm$^2$, however other sizes may be used as well. A smaller cell size will allow for increased cell density and improved accuracy. Details of a preferred implementation of the cell 208 are presented in FIGS. 3A and 3B.

The opto device array 204 includes a plurality of opto device cells 210, with each cell 210 preferably including either an optical detector (such as a photodiode) or a light source, such as a laser. Each cell 210 in the opto device array 204 is preferably associated with a respective cell 208 in the lens array 202 to enable each microlens to operate in cooperation with its associated optical detector or light source.

The driver array 206 includes a plurality of driver cells 212 and provides power, communication, and computation functionality to the system 200. Power may be provided by connection to an external power source, such as a battery or solar cell array, or it may emanate from an integrated power source. Communications may be provided by a grid of connections linking the plurality of driver cells 212 to one another. In addition, the driver array 206 may provide one or more output signals to external equipment, such as weaponry or communication/computation equipment, for example. In addition to power and communications, the driver array 206 may provide the processing capability to perform computations for determining the location of a detected remote laser source and/or for positioning microlenses in the lens array 208 for to cause lasers in the system 200 to perform reciprocal targeting. In a preferred embodiment, the driver array 206 includes a plurality of distributed processors, rather than a single processor for the entire system 200. If each lens array cell 208 and associated opto device cell 210 has its own processor in its own associated driver cell 212, the computational burden is distributed throughout the entire array, resulting in simplified calculations and faster operation. The distributed processors may be implemented in any of several forms, including commercially available micro-processors (e.g. from IBM, HP, and others) or ASICs (Application Specific Integrated Circuits), for example. To allow the processors to perform calculations, a memory may provided with each processor (or for use by a plurality of processors).

In a preferred embodiment, the system 200 is approximately between 0.1 m$^2$ for use on military personnel to approximately 1 m$^2$ for use on military vehicles or installations. Of course, smaller or larger implementations may be used to meet design goals, such as size, power draw, and/or accuracy. A larger implementation is likely to be more accurate at the expense of increased power consumption, while a smaller implementation will be more portable and lightweight. In addition, while the system 200 is shown as a single contiguous unit, it may alternatively be distributed less densely over a larger area. This may improve accuracy, but might sacrifice speed due to longer links between individual cells.

Because the system 200 is preferably constructed using MEMS hardware, it is lightweight and easy to deploy. Power consumption is minimal, with very little power consumption until a light source, such as a semiconductor laser, is deployed.

FIGS. 3A and 3B are pictorial diagrams illustrating top and side views, respectively, of a representative cell 300 in an apparatus for laser source detection, according to an exemplary embodiment of the present invention. The cell 300 includes a lens portion 302, an opto device portion 304, and a driver portion 306. Portions 302, 304, and 306 may be respective portions of arrays 202, 204, and 206 described with reference to FIG. 2.

The lens portion 302 includes a microlens 308, y-axis comb drives 314a and 314b, x-axis comb drives 316a and 316b, x-axis suspension members 318a-d, y-axis suspension members 320a-d, a base portion 322, and lens holders 324a and 324b. The representative cell 300 has an approximate size of 1 mm$^2$.

The structure of lens portion 302 may be realized through standard MEMS processing techniques, such as a series of silicon structuring steps including patterning and etching appropriate layers of silicon and oxides. The suspended lens arrangement may be constructed, for example by depositing an optically transparent material over a sacrificial layer, which is removed to produce the cavity through with the lens may focus light from a remote source or from an opto device contained in the opto device portion. In a preferred embodiment, the lens is approximately 0.1 mm in diameter and has a travel range of approximately 0.05 mm in the x- and y-directions, a resolution of approximately 0.0005 mm (0.5 µm), a speed of 5-10 kHz, a focal length of approximately 0.12/0.32 mm, and a refractive index of about 3.4.

A potential may be applied to the comb drives 314a-b and 316a-b to cause an electrostatic force to move the microlens 308 in the x- and y-axes. The final position of the microlens 308 may be determined through any of a number of techniques, such as by measuring the capacitance of the comb drives or by applying a sinusoidal wave voltage to the comb drives at the natural resonant frequency of the suspended microlens, so that its position may be calculated based on the applied voltage. Determining the position of the lens allows the cell 300 to be used to determine the location of the source of incoming light, or to confirm that outgoing light is accurately positioned.

The suspension members 318a-d and 320a-d allow movement of the microlens 308 along the x- and y-axes of the comb drives 314a-b and 316a-b. Although actuators and movement mechanisms have been described and illustrated for two perpendicular axes, other arrangements for movement and actuation may also be used.

The opto device portion 304 includes an opto device 310, and may include additional circuitry and/or connections to enable the opto device 310. Alternatively, some or all of the additional circuitry and/or connections may be located elsewhere, such as in the driver layer 306.

In the example of FIGS. 3A and 3B, the opto device is a semiconductor laser, namely, a VCSEL (Vertical Cavity Surface Emitting Laser). Other types of semiconductor lasers may be used, as may other types of light sources. Aperature 328a-b provides the opening for emitting laser energy. The microlens 308 is located at a sufficient distance from the opto device 310 (i.e. the VCSEL) to allow the emitted laser to be focused adequately.

Details on construction and operation of surface emitting lasers may be found, for example, in "Surface-emitting microlasers for photonic switching and interchip connections," Optical Engineering, 29, pp. 210-214, March 1990. For other examples, note U.S. Pat. No. 5,115,442, by Yong H. Lee et al., issued May 19, 1992, and entitled "Top-emitting surface emitting laser structures," and U.S. Pat. No. 5,475, 701, by Mary K. Hibbs-Brenner, entitled "Integrated laser power monitor," which are both hereby incorporated by reference. Also, see "Top-surface-emitting GaAs four-quantum-well lasers emitting at 0.85 .mu.m," Electronics Letters, 26, pp. 710-711, May 24, 1990. The laser described has an active region with bulk or one or more quantum well layers. The quantum well layers are interleaved with barrier layers. On opposite sides of the active region are mirror stacks formed by interleaved semiconductor layers having properties such that each layer is typically a quarter wavelength thick at the wavelength (in the medium) of interest thereby forming the mirrors for the laser cavity. There are opposite conductivity type regions on opposite sides of the active region, and the laser is turned on and off by varying the current through the active region. However, a technique for digitally turning the laser on and off, varying the intensity of the emitted radiation from a vertical cavity surface emitting laser by voltage, with fixed injected current, is desirable. Such control is available with a three terminal voltage-controlled VCSEL described in U.S. Pat. No. 5,056,098, by Philip J. Anthony et al., and issued Oct. 8, 1991, which is hereby incorporated by reference.

The opto device 310 may alternatively be a light detector, such as a photodiode. While a semiconductor laser, such as a VCSEL, may be used to transmit light out (e.g. for optical communication and/or reciprocal targeting), a light detector allows for detection of incoming light, and, in some embodiments, location of the source of the received light. The distance (i.e. the focal length) between the microlens 308 and the opto device 310 (i.e. the photodiode) is such that light passing through the microlens 308 is substantially focused onto the opto device 310. Then, as the microlens 308 is moved along the x- and y-axes, the light detector will be best able to determine intensity, which, in some embodiments, is used to determine the location of the source, as described in further detail below.

The driver portion 306 includes a processor 312, a connection 330a-b, a substrate 332, and a spacer layer 334. In some embodiments, more or fewer components may make up the driver portion 306.

The processor 312 is in communication with the lens portion 302 and the opto device portion 304 to provide control, calculation, and data acquisition functions. For example, the processor 312 may provide appropriate signals, such as through semiconductor traces or metallizations, to cause translation of the microlens 308 in the x- or y-axis and to determine lens position, as discussed above. Similarly, the processor 312 may control the opto device 310 (e.g. power-up the VCSEL or receive information from the photodiode). In determining the lens location at which the strongest energy is detected, four samples are preferably taken for each cell 300 to determine a vector toward the center of the laser energy seen by the cell 300.

The processor 312 for the cell 300 is shown as a single cell-based processor, rather than a processor serving many cells or even the whole array. While a processor could serve many cells in some embodiments, preferred implementations maintain the one processor per cell arrangement, to promote faster computation and control, as speed is essential in a battlefield context. In addition, the algorithms for determining lens position, calculating vectors for determining strongest energy locations, and determining the source of incoming light are preferably done in hardware to achieve faster and more robust results.

The connections 330a and 330b allow the processor 312 to communicate with processors in four neighboring cells. (See, for example, the neighboring cells and neighboring processors in the arrays shown in the system 200 of FIG. 2.) The processor 312, in turn, may also pass on information from all or some of its neighboring processors to each neighboring processor. As a result, every processor can obtain communications from every other processor in the array. Of course, information from cells containing photodiodes may be used for detecting light (and possibly location), while information from cells containing semiconductor lasers may be used for transmitting a focused column of light.

By receiving communications corresponding to many cells, the processor 312 can assist in determining the approximate location of a light source. In one embodiment, each processor stores a table of these observations. A partial example of such a table is shown below as Table A.

TABLE A

| NODE | ENERGY SEEN | LOCATION | WHEN |
| --- | --- | --- | --- |
| 425 | 1020 | 45.367° 121.24 M | 12:00 01.0035 |
| 431 | 1044 | 45.380° 121.25 M | 12:00 01.0102 |
| 418 | 989 | 45.388° 121.24 M | 12:00 01.0199 |
| ... | ... | ... | ... |

In a preferred embodiment, tens of thousands of cells 300 are included in each array. When control is distributed over this many cells processing loads are distributed, errors are averaged, and greater fault-tolerance is realized. Of course, as MEMS technology improves fewer cells may provide similar performance.

Errors in location of a target, such as the source of received laser light may be due to errors in positioning the lens 308. Tangential (side-to-side) errors are likely to be very low, so that a target 1 km away could be located to within 1.0 m. The radial (distance away) error can be more significant, however. By including a large number of cells, average errors result in tighter bounds on the target location. Simple averaging of location estimates of pairs of cells is not likely to work, however, due to a highly skewed distribution of location estimates. To ease the computational burden, alternative coordinate systems, such as an angular coordinate system can be used, and the results can be converted to polar or Cartesian coordinates. In a preferred embodiment, the output of 10,000 pairs of cells 300 1 m apart includes a tangential location along with an estimated distance and confidence indicator (e.g. lower bound=967.57 m, upper bound=1034.68 m, confidence=95%).

Figure 4A:
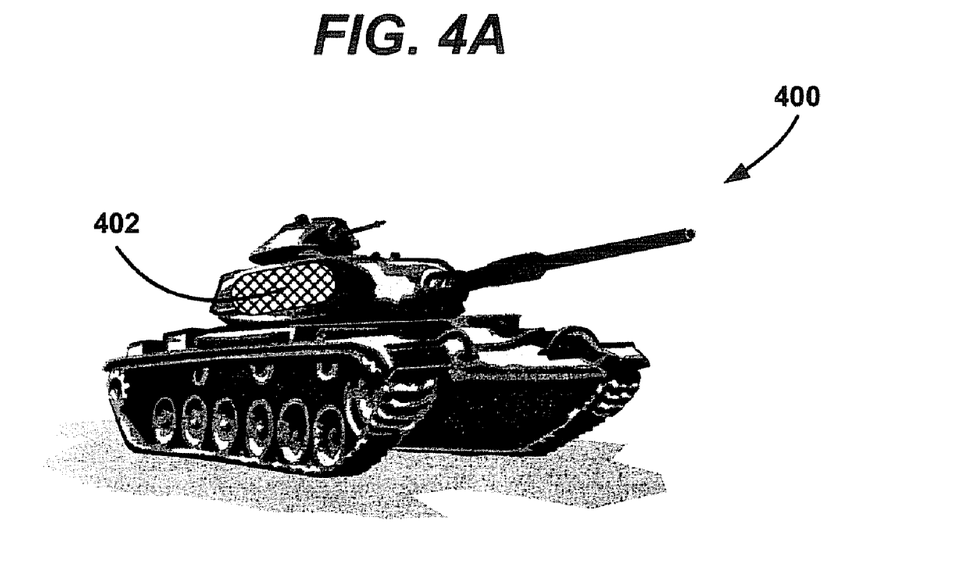
FIGS. 4A and 4B are pictorial diagrams illustrating placement of a system for laser source detection on military vehicles, according to exemplary embodiments of the present invention.
Figure 4B:
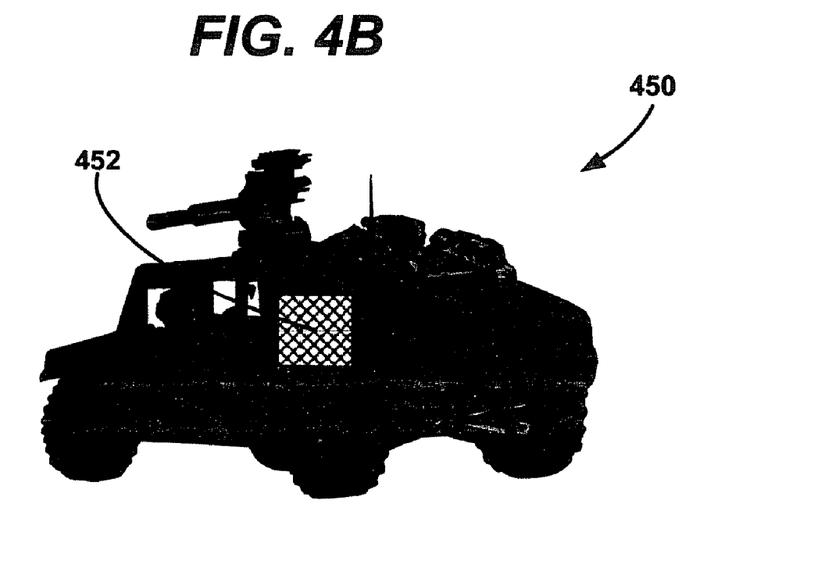
Figure 5A:
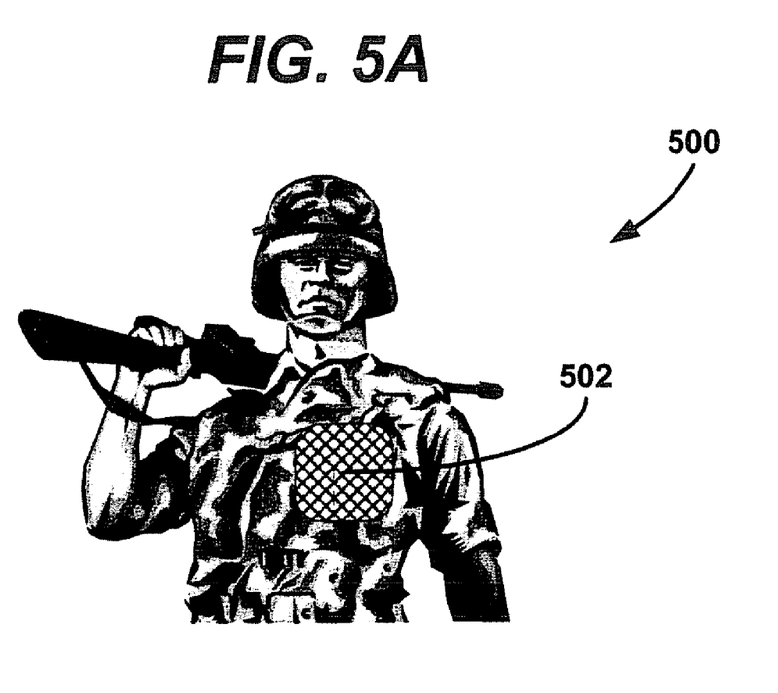
FIGS. 5A and 5B are pictorial diagrams illustrating placement of a system for laser source detection on military personnel, according to exemplary embodiments of the present invention.
Figure 5B:
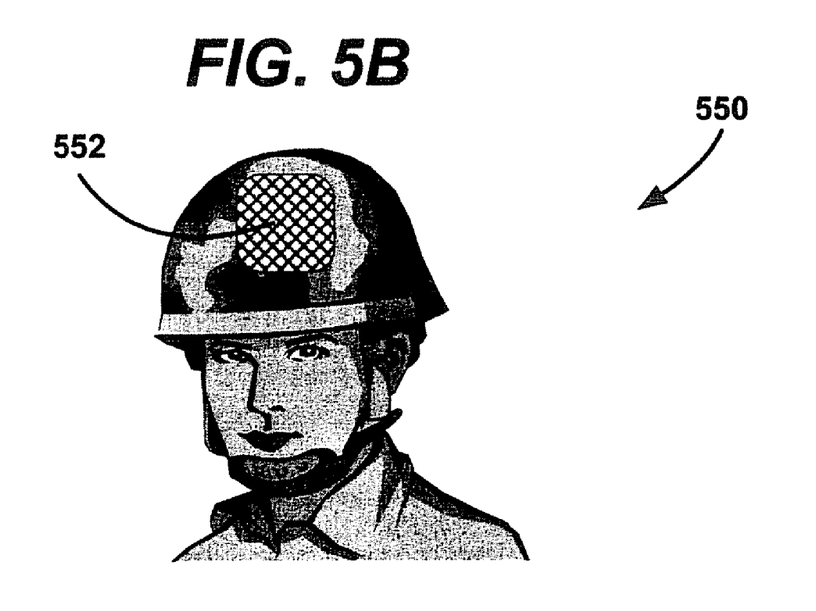

FIG. 4A and 4B are pictorial diagrams illustrating placement of systems 402 and 452 for laser source detection on military vehicles 400 and 450, according to exemplary embodiments of the present invention. FIG. 5A and 5B are pictorial diagrams illustrating placement of systems 502 and 552 for laser source detection on military personnel 500 and 550, according to exemplary embodiments of the present invention. The systems 402, 452, 502, and 552 may be similar to the system 200 shown in FIG. 2, utilizing cells like cell 300 in FIGS. 3A and 3B. Of course, a facility, such as a vehicle, is more likely to be able to accommodate a larger system than would a person. In a preferred embodiment, the system is implemented as a "patch" attached to a soldier or vehicle.

Figure 6A:
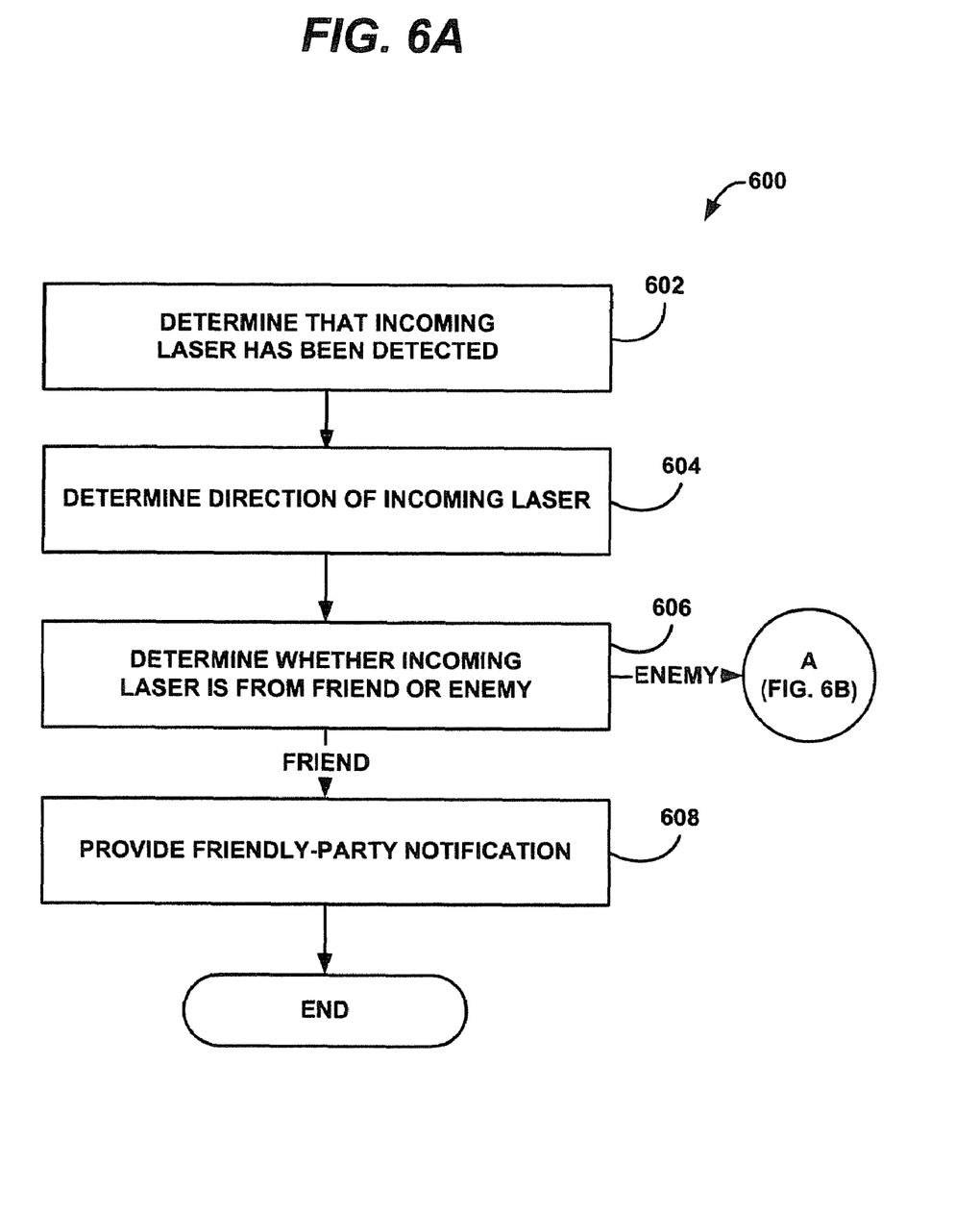
FIGS. 6A and 6B show a flow diagram illustrating a method for laser source detection, according to an exemplary embodiment of the present invention.
Figure 6B:
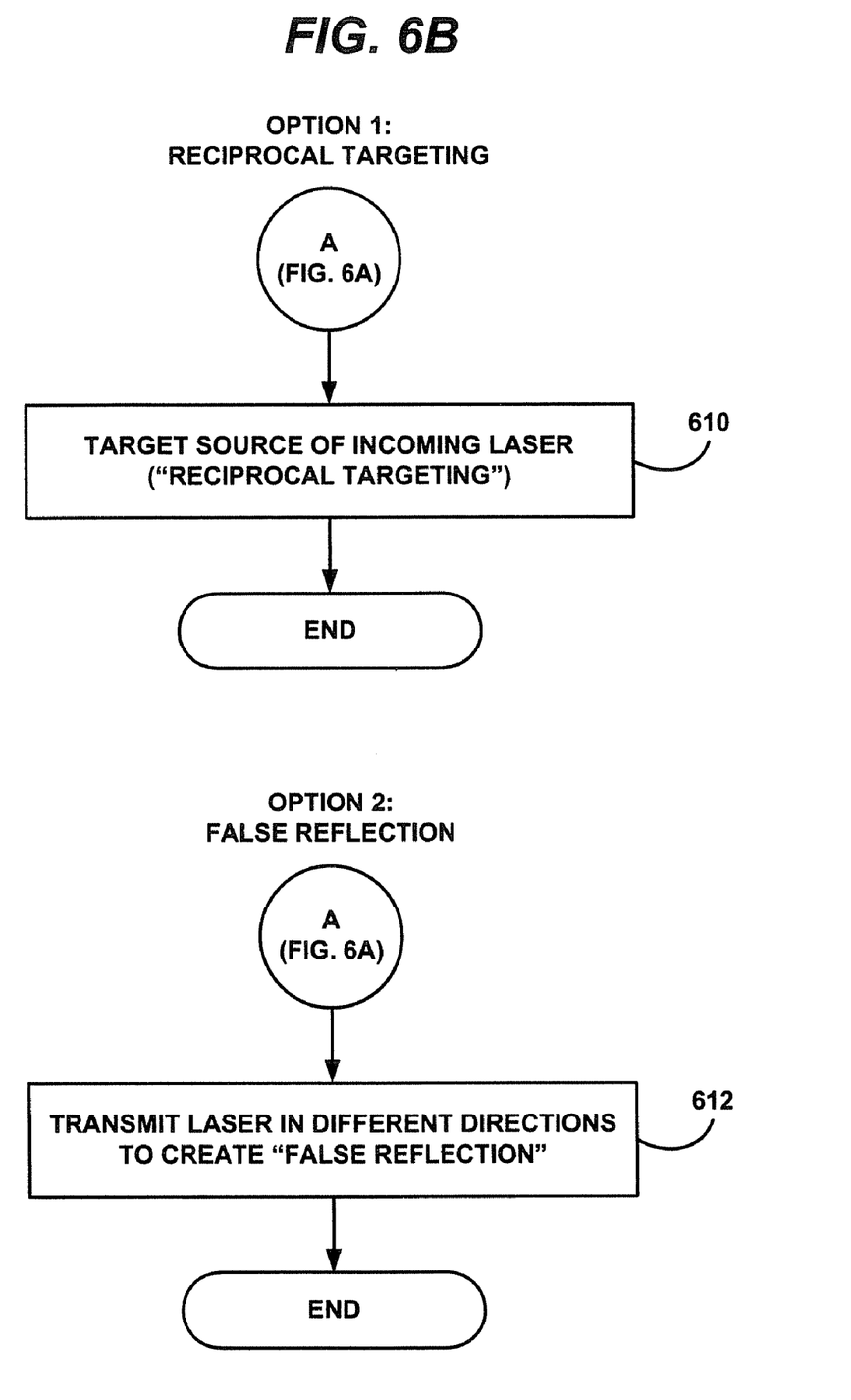

FIG. 6A and 6B show a flow diagram illustrating a method 600 for laser source detection, according to an exemplary embodiment of the present invention. In 602, the system determines that an incoming laser has been detected. In 604, the direction of the incoming laser is determined. In 606, a determination is made as to whether the incoming laser is from a friend or enemy. If the incoming laser is from a friend, then the system provides friendly-party notification, as shown in 608. If the incoming laser is from an enemy, then at least two options are available. According to a first option, the source of the incoming laser is targeted, as shown in 610. According to a second option, as shown in 612, the system transmits a laser in a plurality of directions to create a "false reflection." The false reflection may cause an incoming munition having a laser lock to break its lock and miss the facility upon which the system is mounted.

The method 600 may make use of the system described in FIGS. 1-5B or it may make use of a different system. Detection of an incoming laser (block 602) may be accomplished using practically any laser detection scheme. Location of the laser source (block 604) may be done using computerized or manual techniques or a combination of the two. For example, the approach described with respect to FIGS. 1-5B may be used, in which an array of photodiodes receive light through an array of lenses and an array of communicating processors determines the location based on energy strength.

Determining whether an incoming laser is from a friend or enemy (606) is preferably accomplished by examining an optical code carried by the incoming laser and the wavelength of the laser. For example, identification may be based on a targeting code used by a designator. Some typical laser target designator codes include A-Code laser codes (AGM-114K Hellfire missile) and NATO STANAG No. 3733 codes. The codes specify the PRF (Pulse Repetition Frequency) of a laser emitter. Lower codes indicate a lower PRF, which allows for better target designation due to higher emitted power. The wavelength of the laser may be determined by having different detectors 310 in the array 200 tuned to be sensitive to different wavelengths.

Friendly-party notification (block 608) preferably comprises transmitting back an identification code (e.g. a combat ID) by laser. Known signaling techniques may be used, and one or more lasers may be used for signaling. In alternative embodiments, other means of providing friendly-party notification may be used, such as RF transmissions, visible light, or others.

Reciprocal targeting (block 610) may be performed using techniques similar to those used by typical laser designators. If the system of FIGS. 1-5B is used, the lenses overlying the semiconductor lasers should be translated to provide the desired intensity of laser light. The laser should be directed toward the target, as determined in block 604. Obviously, a system having a faster response time will be better able to provide location information for reciprocal targeting. Once reciprocal targeting has been employed, the source target can be targeted by a smart munition. For example, the laser can be used to guide a beam-riding munition.

In a preferred embodiment, false reflection (block 612) includes using a large number of lasers, such as the array of VCSELs shown in FIGS. 1-5B, to overwhelm and confuse an incoming laser-guided munition. Alternatively, and likely less effectively, a smaller number of lasers can be pulsed in different directions.

The blocks shown in FIGS. 6A and 6B may be performed in orders other than those shown. For example, determining the direction of an incoming laser (block 604) may be performed after determining whether the incoming laser is from a friend or enemy (block 606). Moreover, while a number of post-detection action sequences have been described, other similar sequences or combinations of sequences may be employed without departing from the intended scope of the application.

Exemplary embodiments of the present invention have been illustrated and described. It will be understood, however, that changes and modifications may be made to the invention without deviating from the spirit and scope of the invention, as defined by the following claims.

We claim:

1. A method for reciprocal targeting of a source of an incoming laser, comprising:
   a. determining a direction of the incoming laser by
      i. receiving energy from the incoming laser through a plurality of microlenses on a corresponding plurality of opto devices, wherein at least two of the plurality of opto devices are photodiodes,
      ii. translating each of the plurality of micro lenses to a plurality of lens positions, iii. determining the energy detected at the at least two photo diodes for each of the plurality of lens positions, and
iv. determining an estimate of the direction;
b. identifying an optical code in the incoming laser and determining whether the optical code is associated with at least one of a friendly party and an enemy; and
c. upon determining that the incoming laser is not from the friendly party, targeting the source of the incoming laser by transmitting at least one laser toward the source of the incoming laser.

2. The method of claim 1, wherein targeting the source of the incoming laser includes adjusting a plurality of micro lenses overlying semiconductor lasers to focus the at least one laser toward the estimate of the direction.

3. The method of claim 2, wherein determining the direction and determining whether the optical code is associated with at least one of the friendly party and the enemy are performed by a plurality of processors associated with the plurality of micro lenses and the plurality of opto devices.

* * * * *